United States Patent
Park et al.

(10) Patent No.: US 7,365,660 B2
(45) Date of Patent: Apr. 29, 2008

(54) METHOD AND DEVICE FOR DECODING SYNTAX ELEMENT IN CABAC DECODER

(75) Inventors: In-cheol Park, Daegeon (KR); Yong-seok Yi, Cheonan-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 11/594,113

(22) Filed: Nov. 8, 2006

(65) Prior Publication Data

US 2007/0103347 A1 May 10, 2007

(30) Foreign Application Priority Data

Nov. 8, 2005 (KR) .................. 10-2005-0106359

(51) Int. Cl.
*H03M 7/00* (2006.01)
(52) U.S. Cl. .................. 341/107; 341/50; 341/51; 382/239
(58) Field of Classification Search ........... 341/107, 341/50, 106, 51; 382/239; 375/240.25, 375/240.23; 717/141
See application file for complete search history.

(56) References Cited

U.S. PATENT DOCUMENTS

| | | | |
|---|---|---|---|
| 2004/0240559 A1* | 12/2004 | Prakasam et al. | 375/240.25 |
| 2004/0260739 A1* | 12/2004 | Schumann | 708/322 |
| 2004/0268329 A1* | 12/2004 | Prakasam | 717/141 |
| 2005/0062746 A1 | 3/2005 | Kataoka et al. | |
| 2005/0074176 A1* | 4/2005 | Marpe et al. | 382/239 |
| 2005/0123207 A1* | 6/2005 | Marpe et al. | 382/239 |
| 2005/0147172 A1* | 7/2005 | Winger et al. | 375/240.23 |

FOREIGN PATENT DOCUMENTS

| | | |
|---|---|---|
| JP | 8-46520 A | 2/1996 |
| JP | 11-103257 A | 4/1999 |

\* cited by examiner

*Primary Examiner*—Jean B Jeanglaude
(74) *Attorney, Agent, or Firm*—Sughrue Mion, PLLC

(57) ABSTRACT

A method and a device for decoding a syntax element in a context-based adaptive binary arithmetic coding (CABAC) decoder perform a binary arithmetic coding (BAD) process and a binarization matching (BM) process in parallel. The method includes determining an expected bin value to make a bin string including the bin value valid while generating a one-bit bin value by performing a BAD process for a syntax element to be decoded; determining whether the generated bin value is the same as the expected bin value; generating the decoded value of the syntax element by de-binarization of a bin string including the generated bin value if the bin value generated in the BAD process is the same as the expected bin value; and performing the BAD process to generate the next bin value if the bin value generated in the BAD process is different from the expected bin value.

20 Claims, 6 Drawing Sheets

FIG. 5
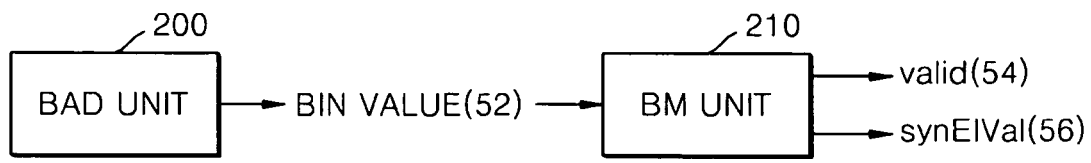
FIG. 6
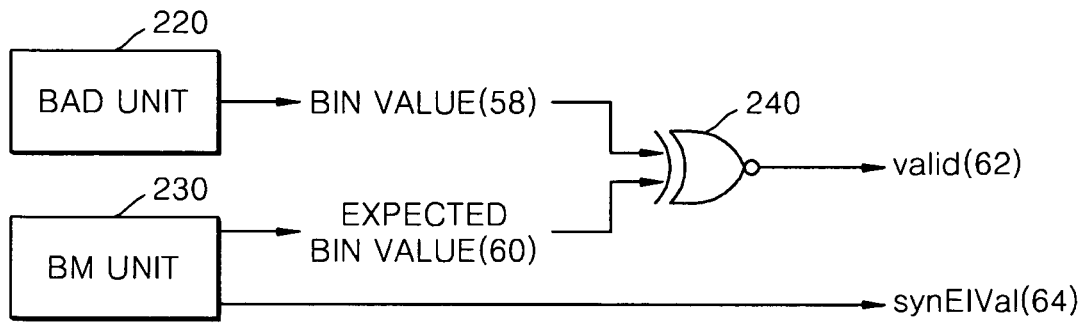
FIG. 7
| Command | Description |
|---|---|
| NOP | No operation |
| CFG | Configures the BM_UNIT to have the initial state of a certain binarization type |
| OP | Actual operation; decide the validity of the assembled bin string, make state transitions, perform de-binarization, etc. |

| Test Sequence | | | Sequentially (cycles) | In parallel (cycles) | Improvement (%) |
|---|---|---|---|---|---|
| Name | Number of Frames | Frame Size | | | |
| salesman | 81 | 176x144 | 4,400,250 | 3,619,992 | 17.7 |
| foreman | 199 | 176x144 | 7,026,135 | 5,866,076 | 16.5 |
| silent | 59 | 176x144 | 3,114,505 | 2,564,292 | 17.7 |
| | | | | Average | 17.3 |

METHOD AND DEVICE FOR DECODING SYNTAX ELEMENT IN CABAC DECODER

CROSS-REFERENCE TO RELATED PATENT APPLICATION

This application claims priority from Korean Patent Application No. 10-2005-0106359, filed on Nov. 8, 2005, in the Korean Intellectual Property Office, the disclosure of which is incorporated herein in its entirety by reference.

BACKGROUND OF THE INVENTION

1. Field of the Invention

Methods and apparatuses consistent with the present invention relate to CABAC decoding, and more particularly, to performing binary arithmetic decoding and binarization matching in parallel in CABAC decoding.

2. Description of the Related Art

Contex-based adaptive binary arithmetic coding (CABAC) is an entropy coding method used in a main profile of the ITU Telecommunication Standardization Sector (ITU-T) digital video codec standard for Advanced Video Coding (H.264/AVC). In CABAC, each symbol is dynamically coded using statistical features to update its relative probability, thereby improving compression efficiency.

CABAC decoding is a process of sequentially decoding a plurality of binary values (0 or 1), that is, a number of "bins," from a syntax element (SE) which is encoded by a CABAC encoder. To decode each bin, several unit processes are required, which may include a context selection process, a context model loading process, a binary arithmetic decoding process, a binarization matching process, and a context model update process. The respective unit processes can be performed in one cycle. When the unit processes are not performed in parallel, five cycles are required to decode each bin. Thus, it is not possible to perform a real time decoding process for a screen larger than that of a standard definition (SD) grade.

Therefore, what is needed is a decoding method for performing a binary arithmetic decoding process and a binarization matching process in parallel to reduce the decoding time.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides a method of decoding a syntax element in a CABAC decoder, by which the decoding time can be reduced by performing a binary arithmetic coding (BAD) process and a binarization matching (BM) process in parallel.

The present invention also provides a decoding device for performing the method of decoding the syntax element.

The present invention also provides a computer-readable medium having embodied thereon a computer program for executing the method of decoding the syntax element.

According to an aspect of the present invention, there is provided a method of decoding a syntax element in a CABAC decoder. The method may include: determining an expected bin value to make a bin string including the expected bin value valid, while generating a bin value of one bit by performing a BAD process for a syntax element to be decoded; determining whether the bin value generated in the BAD process is the same as the expected bin value; generating the decoded value of the syntax element by debinarization of a bin string including the generated bin value, when it is determined that the bin value generated in the BAD process is the same as the expected bin value; and performing the BAD process to generate the next bin value, when it is determined that the bin value generated in the BAD process is different from the expected bin value.

According to another aspect of the present invention, there is provided a device for decoding a syntax element. The device may include: a BAD (binary arithmetic decoding) unit which performs a BAD process on a syntax element to be decoded and generates a bin value of one bit; an expected bin value determining unit which determines an expected bin value to make a bin string including the expected bin value valid, while performing the BAD process; and a bin string validity determination unit which determines whether the bin string including the generated bin value is valid if the bin value generated in the BAD process is the same as the expected bin value.

BRIEF DESCRIPTION OF THE DRAWINGS

The above and other aspects of the present invention will become more apparent by describing in detail exemplary embodiments thereof with reference to the attached drawings in which:

FIG. 5 is a block diagram illustrating a structure of a decoding device not performing unit processes in parallel;

FIG. 6 is a block diagram illustrating a structure of a decoding device performing unit processes in parallel according to an exemplary embodiment of the present invention;

FIG. 7 is a table illustrating an example of commands for controlling a binarization matching unit;

DETAILED DESCRIPTION OF THE EXEMPLARY EMBODIMENTS

A decoding method and device according to an exemplary embodiment of the present invention will be described in detail with reference to the accompanying drawings.

Figure 1:
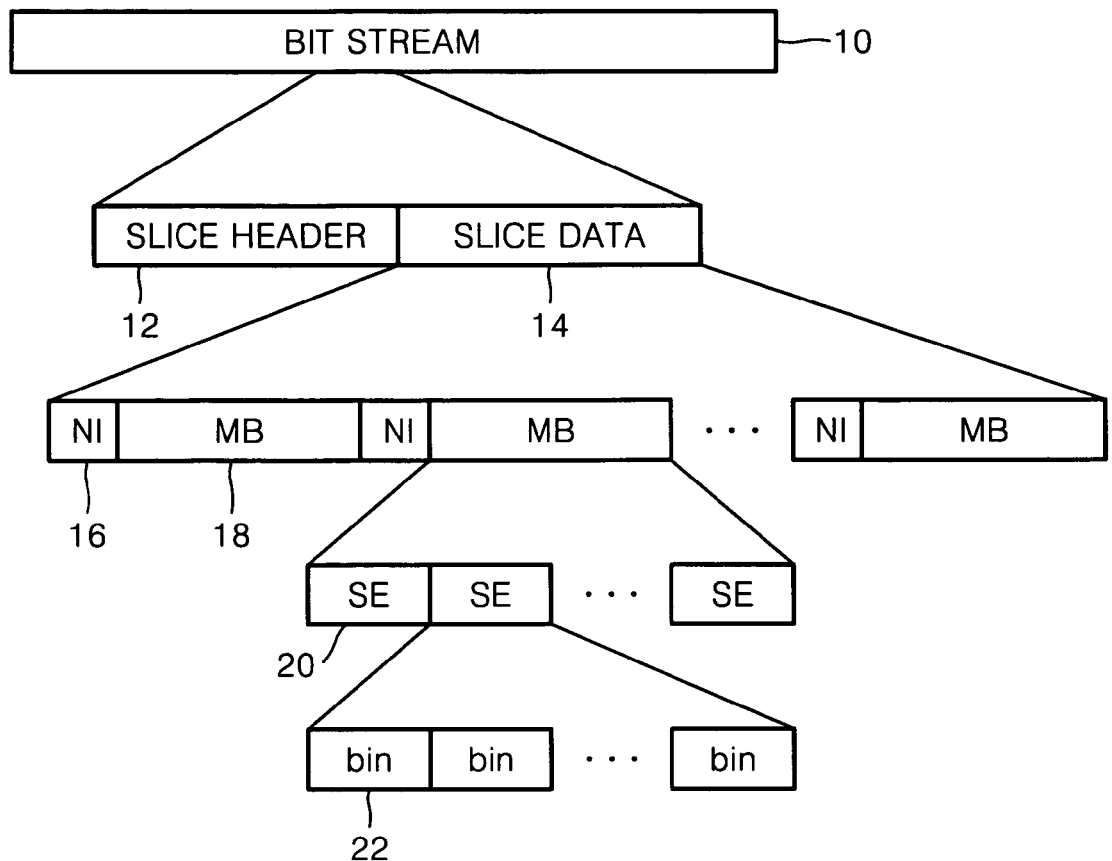
FIG. 1 illustrates a hierarchical structure of H.264/AVC decoding.

FIG. 1 illustrates a hierarchical structure of H.264/AVC decoding.

Referring to FIG. 1, a bitstream 10 in H.264/AVC consists of a set of syntax elements (SE) 20 similarly to other moving picture compression standards.

The bitstream includes one or more slices. The slice consists of a slice header 12 and slice data 14.

The slice data 14 includes one or more macroblocks (MB) 18. The MB further includes a neighbor identifier (NI) 16 which represents a border between neighboring MBs. Data of the neighboring MB is used when a context selection is performed for SEs 20 in the current MB 18.

The MB 18 includes one or more SEs 20. The SE 20 consists of a binary string including a plurality of bins 22.

Figure 2:
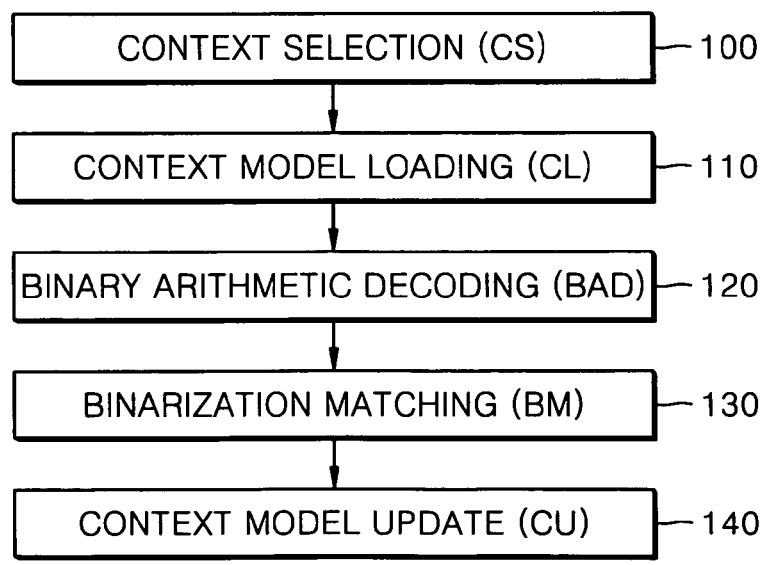
FIG. 2 illustrates unit processes for decoding one bin.

FIG. 2 illustrates unit processes for decoding one bin. Referring to FIG. 2, unit processes such as context selection (CS) process 100, context model loading (CL) process 110, binary arithmetic decoding (BAD) process 120, binarization matching (BM) process 130, and context model update (CU) process 140 are performed to decode each bin.

The CS process 100 is a process for selecting a context model needed for decoding one bin. The CL process 110 is a process for reading the selected context model. In the BAD process 120, one bin value is generated. In the BM process 130, the generated bin value is checked to determine whether it constitutes a valid binary string. In the BAD process 120, a value of a current context model may be changed according to the generated bin value. In the CU process 140, if the value of the context model is modified in the BAD process 120, the modified value of the context model is stored in a memory.

In general, the compression efficiency of H.264/AVC depends on the CABAC. Thus, the performance of H.264/AVC is improved by the improvement of the performance of the CABAC decoding. The CABAC decoding is a process of sequentially decoding bins with the value of "0" or "1". To decode one bin, several unit processes are sequentially performed. It is difficult to perform these unit processes in parallel due to their algorithms. Therefore, it is difficult to reduce the processing time for decoding bins, that is, latency.

Figure 3:
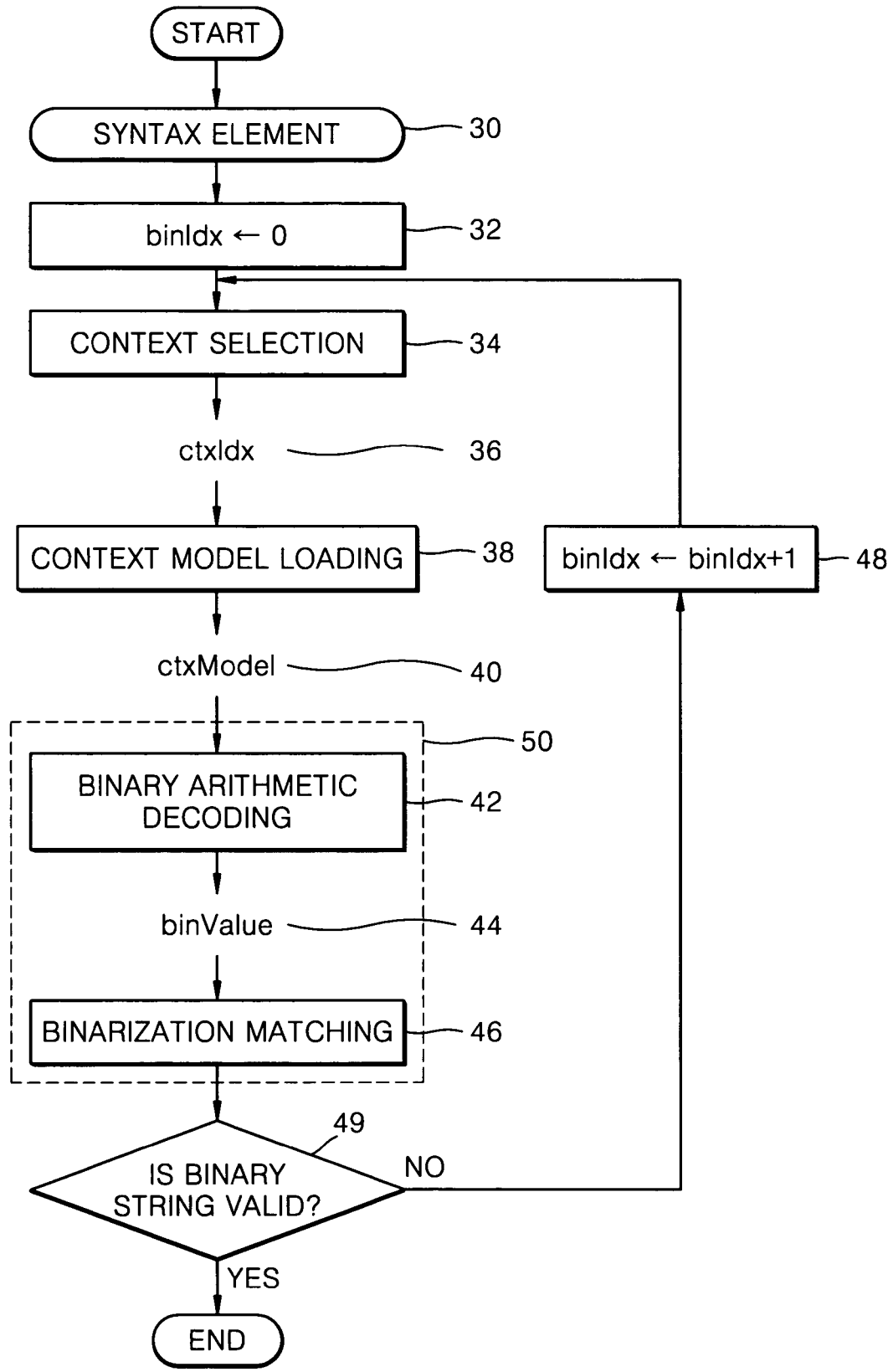
FIG. 3 is a flowchart illustrating in detail each unit process and the result value of the unit process in the process of decoding one syntax element.

FIG. 3 is a flowchart illustrating each unit process and the result value of the unit process in the process of decoding one syntax element, in detail.

In an encoding of SE, a value of the SE is converted into a variable length code (VLC) by a binarization process. Examples of the binarization are a unary binarization, a truncated unary binarization, a unary/k-th order Exp-Golomb binarization, a fixed length binarization, and a binarization for a specific SE. The binarization is chosen by taking features of each SE into account, so that the average length of the arithmetic encoded bin string can be minimized.

A result of a variable length coding is a bin string including one or more bins. The bin string is encoded by CABAC. Therefore, the bin string is a result of decoding the SE by CABAC. Each bin has the value of "0" or "1." The most probable bin value in each SE is called a most probable symbol (MPS), and the least probable bin value in each SE is called a least probable symbol (LPS). The probability of occurrences of the MPS is called a symbol probability. The symbol probability has a value ranged 0 to 1, but since it is impossible that the CABAC decoder has a infinite precision, the symbol probability is represented by a quantized value. The symbol probability is represented by a 6-bit probability state index.

For each SE, a statistical characteristic of bins including the probability state index, the MPS value, etc., is different from that of bins in another SE. This statistical characteristic of bins is called a context. There are one or more contexts in each SE, and each context has a probability state index and an MPS value. The probability state index and the MPS value form a 7-bit context model. There are 399 context models in the main profile of H.264/AVC.

To decode one SE 20, each bin 22 corresponding to the SE 20 is sequentially decoded. Referring to FIG. 3, it is determined which SE 20 will be decoded (process 30). Then, the value of bin index binIdx is set to "0" to decode the first bin in the SE (process 32).

To decode each bin in one SE 20, the context corresponding to the bin 22 must be known. The CS process 34 is a process of selecting a context corresponding to the bin 22. Generally, one of 4 contexts corresponds to the first bin in a SE 20. The context is indexed by a context index ctxIdx 36. The context index is expressed by the sum of context index offset (ctxIdxOffset) and context index increment (ctxIdxInc). The context index offset is uniquely defined according to the type of the SE. Accordingly, the ctxIdxInc value is evaluated in the CS process 34.

The sum of the ctxIdxInc value evaluated in the CS process 34 and the ctxIdxOffset is a context index (ctxIdx) 36. The ctxIdx value is converted into an address of context model memory, and the context model (ctxModel) 40 needed for decoding a current bin is read from the memory by using the address. This process is referred to as a CL process 38.

In addition, the CS process 34 may be processed in parallel with the CL process 38. For this, context models corresponding to an SE to be decoded have to be concurrently read from the memory using the ctxIdxoffset. The context models concurrently read from the memory are referred to as candidate context models.

The ctxIdxInc of the SE to be decoded is calculated in parallel with reading candidate context models from the memory. Calculating the ctxIdxInc and loading the candidate context models are performed in one cycle.

In the next cycle, a context model is selected from the read candidate context models using calculated ctxIdxInc.

A BAD process 42 is performed by using the read ctxModel 40. A corresponding bin value (binValue) 44 is generated in the BAD process 42. A 6-bit probability state index and a 1-bit MPS value are included in the ctxModel 40. The probability state index is used for reading a symbol probability, which is the probability of MPS stored in the decoder. The read symbol probability is used for updating a coding range, which is an internal variable of the decoder. The updated coding range is compared with a coding offset, which is a part of bitstream. If the coding offset is less than the coding range, the binValue 44 is MPS, and if the coding offset is greater than or equal to the coding range, the binValue 44 is LPS.

As described above, a BAD result is not an SE, but a bin string, which is the binarization of the SE. When a BAD process is completed, a bin which is a binary value of one bit is generated. The generated binValue is added to the bin string generated at the previous process and the addition result is a new bin string.

To complete the process of decoding the SE, the current bin string has to be valid. The bin string is valid when the bin string is a valid binarization, which means that the bin string can be generated by the binarization and that SE can be generated by de-binarization of the bin string.

When one bin is output by the BAD process, it is determined in a BM process 46 whether the currently generated bin string is valid (process 49). If it is determined that the current bin string is valid in the BM process 46, a de-binarization process is performed to create the value of the SE 20.

If it is determined that the current bin string is invalid, the decoding process is performed for the next bin. To perform the decoding process for the next bin, first the bin index (binIdx) is increased by 1 (process 48) and then the aforementioned process is repeated.

The CS process 34, the CL process 38, and the BAD process 42 may be skipped according to circumstances. The BM process 46 for determining whether to perform the decoding process for the next binis performed.

The BM process 46 may be embodied in a finite state machine (FSM). The FSM includes a finite number of states to make a transition according to an input value. In the case of the unary binarization or the binarization for a specific SE, the state of the FSM makes a transition according to the bin value generated by the BAD. In the case of a fixed-length binarization, the state makes a transition according to the binIdx value. In the case of the other binarizations, the state may make a transition according to the combination of the bin value, the binIdx value and an internal counter value. If the processes are not performed in parallel, the bin value generated by the BAD is stored in a register, and then the stored bin value is used for an input of the BM in the next cycle, and therefore one more cycle is used.

Since the BM (46) is embodied using the FSM, a determination may be made prior to the BAD process of which bin value makes the bin string valid and which bin value causes the FSM to make a state transition. Therefore, the BAD and the BM do not need to be performed sequentially. The BAD process 42 and the BM process 46 need two cycles in FIG. 3. However both processes can be performed in parallel in one cycle. The part of the process where the parallel processing according to exemplary embodiments of the present invention is applied is shown by reference numeral 50 in FIG. 3.

Figure 4:
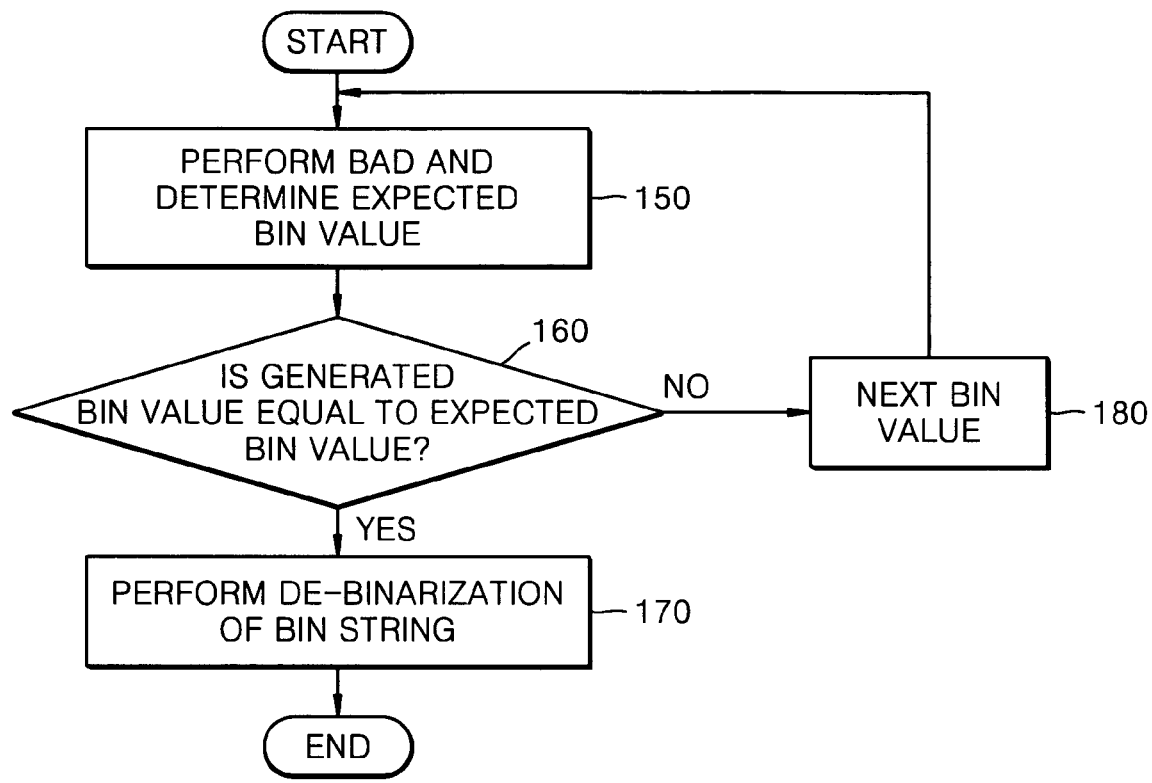
FIG. 4 is a flowchart illustrating a method of decoding a syntax element according to an exemplary embodiment of the present invention.

FIG. 4 is a flowchart illustrating a method of decoding a syntax element according to an exemplary embodiment of the present invention. In this method of decoding SEs, the parallel processing of the BAD process and the BM process is provided. For this, an expected bin value is pre-determined, in parallel with performing the BAD process (operation 150). The expected bin value is defined as the bin value to be generated so that a bin string including the bin value can be valid. When the BAD process is completed and the bin value is generated, the generated bin value is compared with the expected bin value (operation 160). If the values are the same, the bin string including the generated bin value is valid, and the SE is decoded by de-binarization of the bin string (operation 170). If the values are not the same, the BAD process is repeated to generate the next bin value needed for constituting a valid bin string (operation 180). The BAD process, the process of determining the expected bin value, and the process of comparing the generated bin value with the expected bin value are performed in one cycle. Therefore, the number of cycles is reduced by one with respect to the BAD process with sequential processing.

The parallel processing according to exemplary embodiments of the present invention is based on the characteristic that the arithmetic coding of H.264/AVC uses a binary alphabet rather than a multinary alphabet. The arithmetic coding process of H.264/AVC is the binary arithmetic coding process, and the output of the coding process has a value "0" or "1". Therefore, the generated bin value can be compared with the expected bin value by using a simple exclusive NOR operator. In addition, the comparison results are only of two types, so it is easy to prepare the next process for each case.

FIG. 5 is a block diagram showing a structure of a decoding device without parallel processing. Referring to FIG. 5, a decoding device for syntax elements includes a BAD unit 200 and a BM unit 210. In the BAD process, two or less comparison processes, three arithmetic processes and two table lookups are performed, so the processing time is long. Therefore, if the BAD process is not performed in parallel with the BM process, the BAD process and the BM process cannot be performed in one cycle. The bin value 52 of the BAD result is stored in a register, and is input into the BM unit 210 in the next cycle. The BM unit 210 outputs a syntax element value (synElVal) 56, in parallel with outputting a valid flag 54. The BAD process and the BM process are performed over two cycles in the decoding device shown in FIG. 5.

FIG. 6 is a block diagram showing a structure of a decoding device performing parallel processing according to an exemplary embodiment of the present invention. The BM unit 230 calculates the expected bin value 60 while the BAD unit 220 calculates the bin value 58. The bin value 58 is compared with the expected bin value 60 by the exclusive NOR operator in the same cycle. If the values are the same, the value of a valid flag becomes "1", and if the values are different, the valid flag value is "0".

The BM unit 230 outputs the expected bin string which is obtained by adding the expected bin value to the bin string generated from the previous process, as the syntax element value (synElVal) 64, in parallel with outputting the expected bin value 60. The validity of the expected bin string 64 is determined by a valid flag 62. For example, if the value of the valid flag 62 is "1", the expected bin string is a valid bin string.

FIG. 7 is a table showing an exemplary embodiment of commands for controlling a binarization matching unit. The commands in the example shown in FIG. 7 are NOP, CFG, and OP.

The NOP is a command for performing no operation. The CFG is a command for determining a type of binarization based on a type of a syntax element and setting parameters dependent on the binarization type. The OP is a command for performing the BM process.

The CFG is applied for one cycle before the start of decoding a syntax element, and the OP is applied for cycles of performing the BAD process.

Figure 8:
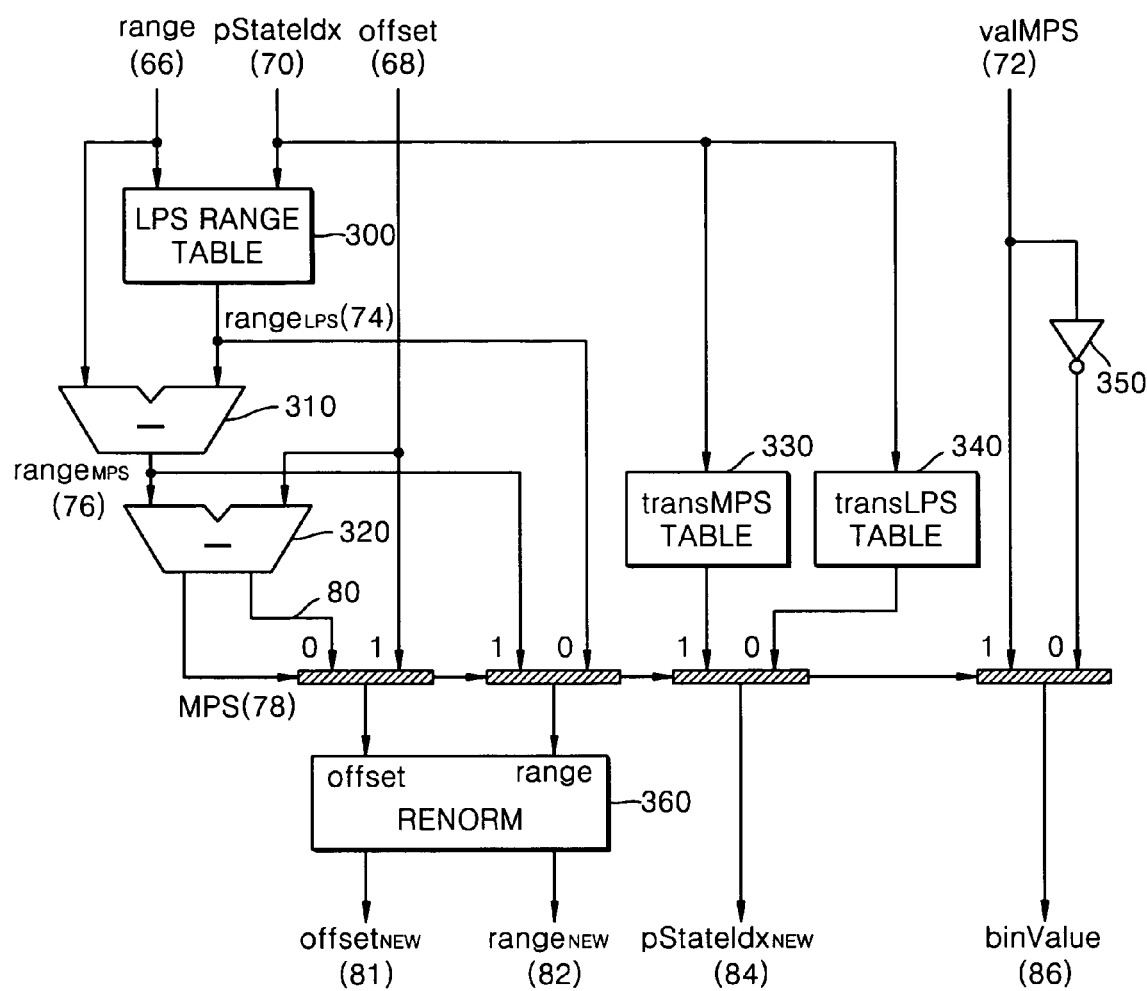
FIG. 8 is a block diagram illustrating a structure of a binary arithmetic decoding unit according to an exemplary embodiment of the present invention.

FIG. 8 is a block diagram showing a binary arithmetic decoding unit according to an exemplary embodiment of the present invention. Referring to FIG. 8, the BAD unit receives a coding range 66, a coding offset 68, a probability state index (pStateIdx) 70, and a MPS value (valMPS) 72 as inputs. The pStateIdx 70 and the MPS value 72 are included in the context model.

An LPS range value 74 is obtained by referring to a LPS range table 300 by using the values of the coding range 66 and the pStateIdx 70. The first subtracter 310 subtracts the LPS range value 74 from the current range value 66 and outputs the MPS range value 76. The second subtracter 320 subtracts the coding offset 68 from the MPS range value 76 and outputs the subtraction result as a new offset value 80. The second subtracter 320 also outputs the sign of the new offset value 80 as the MPS signal 78. That is, if the MPS range value 76 is greater than the coding offset 68, the MPS signal 78 is "1", and if the MPS range value 76 is less than or equal to the coding offset 68, the MPS signal 78 is "0".

The value of the MPS signal 78 has a function of selecting the output signal. If the MPS signal 78 is "1", an offset is the input offset value 68, and a range is the MPS range 76, and a pStateIdx 84 is a value referring to a transMPS table 330, and a bin value 86 is the valMPS 72.

If the MPS signal 78 is "0", the offset is the new offset value 80, a range is the LPS range value 74, a pStateIdx 84 is a value referring to a transLPS table 340, and a bin value 86 is the LPS value. The LPS value is obtained by inverting the valMPS 72 through an inverter 350.

In a renormalization (RENORM) unit 360, a renormalized offset value 81 and a renormalized range value 82 are generated by renormalizing the offset value and the range value.

Figures 9, 10:
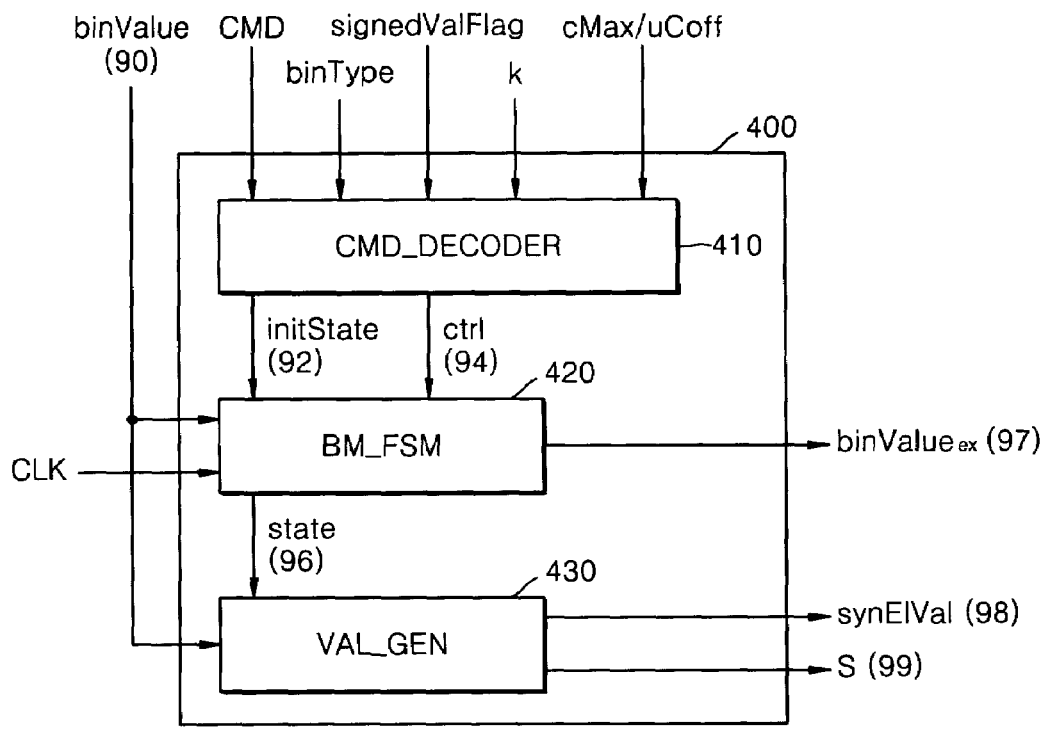
FIG. 9 is a block diagram illustrating a structure of a binarization matching unit according to an exemplary embodiment of the present invention.
FIG. 10 is a table illustrating a comparison between the performance of the CABAC decoder performing unit processes in parallel according to an exemplary embodiment of the present invention and the performance of the conventional CABAC decoder not performing unit processes in parallel.

FIG. 9 is a block diagram showing a binarization matching unit according to an exemplary embodiment of the present invention. Referring to FIG. 9, the BM unit 400 may include a command decoder (CMD_DECODER) 410, a binarization matching finite state machine (BM_FSM) 420, and a value generator (VAL_GEN) 430.

The CMD_DECODER 410 analyzes the input values and generates signals initState 92 and ctrl 94 for controlling the BM_FSM 420, wherein signal initState 92 is a control signal for setting an initial state of the BM_FSM 420 and signal ctrl 94 is a control signal for initializing the BM_FSM 420 or making a state transition.

The BM_FSM 420 performs a state transition according to a bin value 90 and outputs an expected bin value 97.

The VAL_GEN 430 outputs a syntax element value (synElVal) 98 and an S flag 99 by using a state 96 of the BM_FSM 420 and the bin value 90. If the current syntax element is a prefix, the S flag 99 indicates whether decoding a suffix is needed. In the exemplary embodiment of FIG. 9, the syntax element is divided into prefix and suffix, and the prefix and the suffix are treated as different syntax elements. Whether the decoding a suffix is needed is dependent on the decoding result of the prefix.

FIG. 10 is a table showing a comparison of the performance of the CABAC decoder performing parallel processing according to exemplary embodiments of the present invention and the performance of the existing CABAC decoder performing sequential processing. In a table in FIG. 10, an item "Sequentially" indicates the number of cycles in the case without parallel processing, and an item "In parallel" indicates the number of cycles in the case with parallel processing according to exemplary embodiments of the present invention.

In the first example (salesman) of processing 81 frames, the number of cycles is reduced as much as 17.7% through the parallel processing of the exemplary embodiments of the present invention. In the second example (foreman) and the third example (silent), the number of cycles is reduced as much as 16.5% and 17.7%, respectively.

Similarly, the number of cycles needed for decoding is reduced by performing the BAD process and the BM process in parallel, and therefore the decoding time is reduced.

The invention can also be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, and so on.

While the present invention has been particularly shown and described with reference to exemplary embodiments thereof, it will be understood by those skilled in the art that various changes in form and details may be made therein without departing from the spirit and scope of the invention as defined by the appended claims. The exemplary embodiments should be considered in a descriptive sense only and not for purposes of limitation. Therefore, the scope of the invention is defined not by the detailed description of the exemplary embodiments of the invention but by the appended claims, and all differences within the scope will be construed as being included in the present invention.

What is claimed is:

1. A method of decoding a syntax element in a context-based adaptive binary arithmetic coding (CABAC) decoder, the method comprising:

determining an expected bin value to make a bin string including the expected bin value valid, while generating a bin value of one bit by performing a binary arithmetic decoding (BAD) process for a syntax element to be decoded;

determining whether the generated bin value is the same as the expected bin value;

generating a decoded value of the syntax element by de-binarization of a bin string including the generated bin value, if it is determined that the generated bin value is the same as the expected bin value; and performing the BAD process to generate a next bin value, if it is determined that the generated bin value is different from the expected bin value.

2. The method of claim 1, wherein the determining the expected bin value while generating the bin value comprises:

calculating a context index increment of the syntax element to be decoded;

calculating a context index by adding the context index increment to a context index offset which is determined based upon a type of the syntax element;

reading a context model corresponding to the syntax element using the context index; and performing the BAD process on the syntax element using the context model.

3. The method of claim 1, wherein the determining the expected bin value while generating the bin value comprises:

reading candidate context models corresponding to the syntax element while calculating a context index increment of the syntax element to be decoded;

selecting one of the candidate context models using the context index increment; and performing the BAD process on the syntax element by using the selected context model.

4. The method of claim 1, wherein the determining the expected bin value while generating the bin value comprises outputting an expected bin string including the expected bin value.

5. The method of claim 4, further comprising determining that the expected bin string is valid if the bin value generated in the BAD process is the same as the expected bin value.

6. The method of claim 1, wherein the determining whether the bin value generated in the BAD process is the same as the expected bin value comprises:

performing an exclusive NOR process with inputs of the bin value generated in the BAD process and the expected bin value; and determining that the bin value generated in the BAD process is the same as the expected bin value if the output of the exclusive NOR process is "1".

7. A device for decoding a syntax element, the device comprising:
- a binary arithmetic decoding (BAD) unit which performs a BAD process to a syntax element to be decoded and generates a bin value of one bit;
- an expected bin value determining unit which determines an expected bin value to make a bin string including the expected bin value valid, while the BAD unit performs the BAD process; and
- a bin string validity determination unit which determines whether the bin string including the generated bin value is valid based on whether the generated bin value is the same as the expected bin value.

8. The device of claim 7, further comprising a de-binarization unit which generates a decoded value of the syntax element by de-binarization of the bin string including the generated bin value, if it is determined that the bin string including the generated bin value is valid.

9. The device of claim 7, further comprising a context model selection and loading unit which selects a context model required for performing the BAD process to the syntax element and reads the selected context model from memory.

10. The device of claim 9, wherein the context model selection and loading unit comprises:
- a context index increment calculation unit which calculates a context index increment of the syntax element to be decoded;
- a context index calculation unit which calculates a context index by adding the context index increment to a context index offset which is determined depending upon a type of the syntax element; and
- a context model loading unit which reads a context model corresponding to the syntax element by using the context index.

11. The device of claim 9, wherein the context model selection and loading unit comprises:
- a context index increment calculation unit which calculates a context index increment of the syntax element to be decoded;
- a candidate context model loading unit which reads candidate context models corresponding to the syntax element; and
- a context model selection unit which selects one of the candidate context models by using the context index increment.

12. The device of claim 7, wherein the bin string validity determination unit comprises an exclusive NOR operator, wherein the exclusive NOR operator inputs the bin value generated by the BAD process and the expected bin value.

13. The device of claim 7, wherein the expected bin value determining unit comprises an expected bin string output unit which generates the expected bin string including the expected bin value.

14. The device of claim 7, wherein the expected bin value determining unit comprises a binarization matching finite state machine (BM_FSM) which generates the expected bin value according to a state of the finite state machine while making a transition among states according to the bin value generated from the previous process.

15. A computer-readable medium having embodied thereon a computer program for executing a method of decoding a syntax element in a context-based adaptive binary arithmetic coding (CABAC) decoder, the program comprising:
- determining an expected bin value to make a bin string including the expected bin value valid, while generating a one-bit bin value by performing a binary arithmetic decoding (BAD) process for a syntax element to be decoded;
- determining whether the generated bin value is the same as the expected bin value;
- generating a decoded value of the syntax element by de-binarization of a bin string including the generated bin value, if it is determined that the generated bin value is the same as the expected bin value; and
- performing the BAD process to generate a next bin value, if it is determined that the generated bin value is different from the expected bin value.

16. The program of claim 15, wherein the determining of the expected bin value while generating the bin value comprises:
- calculating a context index increment of the syntax element to be decoded;
- calculating a context index by adding the context index increment to a context index offset which is determined based upon a type of the syntax element;
- reading a context model corresponding to the syntax element using the context index; and
- performing the BAD process on the syntax element using the context model.

17. The program of claim 15, wherein the determining of the expected bin value while generating the bin value comprises:
- reading candidate context models corresponding to the syntax element while calculating a context index increment of the syntax element to be decoded;
- selecting one of the candidate context models using the context index increment; and
- performing the BAD process on the syntax element by using the selected context model.

18. The program of claim 15, wherein the determining the expected bin value while generating the bin value comprises outputting an expected bin string including the expected bin value.

19. The program of claim 18, further comprising determining that the expected bin string is valid if the bin value generated in the BAD process is the same as the expected bin value.

20. The program of claim 15, wherein the determining whether the bin value generated in the BAD process is the same as the expected bin value comprises:
- performing an exclusive NOR process with inputs of the bin value generated in the BAD process and the expected bin value; and
- determining that the bin value generated in the BAD process is the same as the expected bin value if the output of the exclusive NOR process is "1".

* * * * *